United States Patent [19]

Miura et al.

[11] Patent Number: 5,126,320

[45] Date of Patent: Jun. 30, 1992

[54] METHOD FOR MANUFACTURING AN OXIDE SUPERCONDUCTING THIN-FILM

[75] Inventors: Tadao Miura, Yokohama; Yoshiaki Terashima, Yokosuka; Akio Hori, Kawasaki; Masayuki Sagoi, Yokohama, all of Japan

[73] Assignee: Kabushiki Kaisha Toshiba, Kawasaki, Japan

[21] Appl. No.: 722,410

[22] Filed: Jun. 26, 1991

Related U.S. Application Data

[63] Continuation of Ser. No. 201,857, Jun. 3, 1988, abandoned.

[30] Foreign Application Priority Data

Jul. 10, 1987 [JP] Japan ................. 62-171220

[51] Int. Cl.$^5$ .................. H01B 12/00; C23C 14/34
[52] U.S. Cl. ................... 505/1; 505/731; 505/816; 204/192.24
[58] Field of Search ............ 204/192.15, 192.12, 204/192.24; 505/826, 730, 731, 816

[56] References Cited

PUBLICATIONS

Evetts et al., "Structural . . . Process . . . Structures", Proceedings of Symposiums, 1987 Spring Meeting of Mat. Res. Soc. Apr. 23-24, 1987.
Zhas et al., "High Tc . . . Thin Films", International Journal of Modern Physics B, vol. 1, No. 2 (1987), 561-564.
Phys. Rev. B 35 (1987) 8824-8825, 1 Jun; H. Adachi, K. Setsune & K. Wasa Superconductivity in $(La_{0.9}Sr_{0.1})_2CuO_4$ single-crystal films.
Jap. J. Appl. Phys. 26 (1987) L709-170, 20 May; H. Adachi, K. Setsune, T. Mitsuyu, K. Hirochi, Y. Ichikawa, T. Kamada & K. Wasa Preparation and Characterization of Superconducting Y-Ba-Cu-O Thin Films.
Jap. J. Appl. Phys. 26 (1987) L738-740, 20 May; M. Kawasaki, S. Nagata, Y. Sato, M. Funabashi, T. Hasegawa, K. Kishio, K. Kitazawa, K. Fueki & H. Koinuma High Tc Yb-Ba-Cu-O Thin Films Deposited on Sintered YSZ Substrates by Sputtering.

*Primary Examiner*—Nam Nguyen
*Attorney, Agent, or Firm*—Oblon, Spivak, McClelland, Maier & Neustadt

[57] ABSTRACT

A method is disclosed which comprises setting a substrate within a mixed gas atmosphere containing 0.1 to 5% of oxygen gas and a balance as an inert gas, and sputtering a target member containing Ln, M, Cu and O within that atmosphere to obtain an oxygen-deficient perovskite type oxide superconducting thin-film of substantially $Ln:M:Cu:O = 1:2:3:(7-\delta)$, where Ln represents at least one element selected from the rare earth elements and M represents at least one element selected from the group consisting of Ba, Sr, and Ca. The oxide superconducting thin-film of that composition ratio has a critical temperature of over 77K.

10 Claims, 4 Drawing Sheets

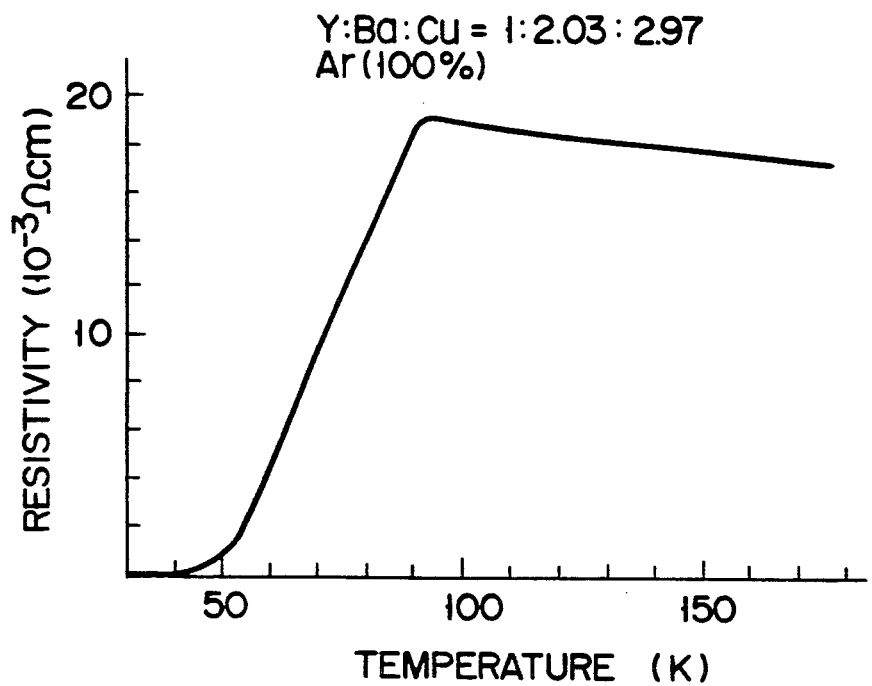
F I G. 4
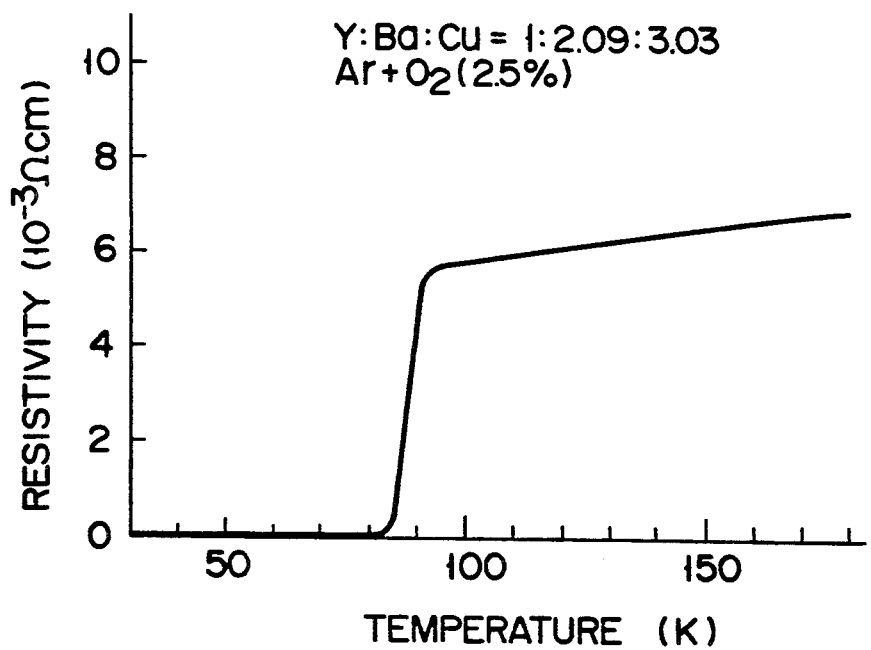
F I G. 5

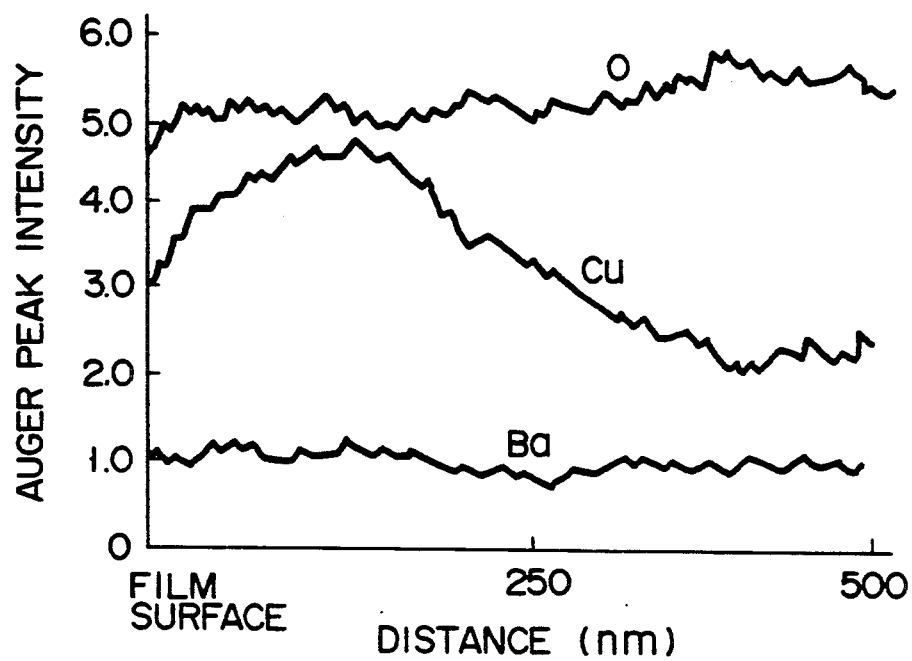
F I G. 6
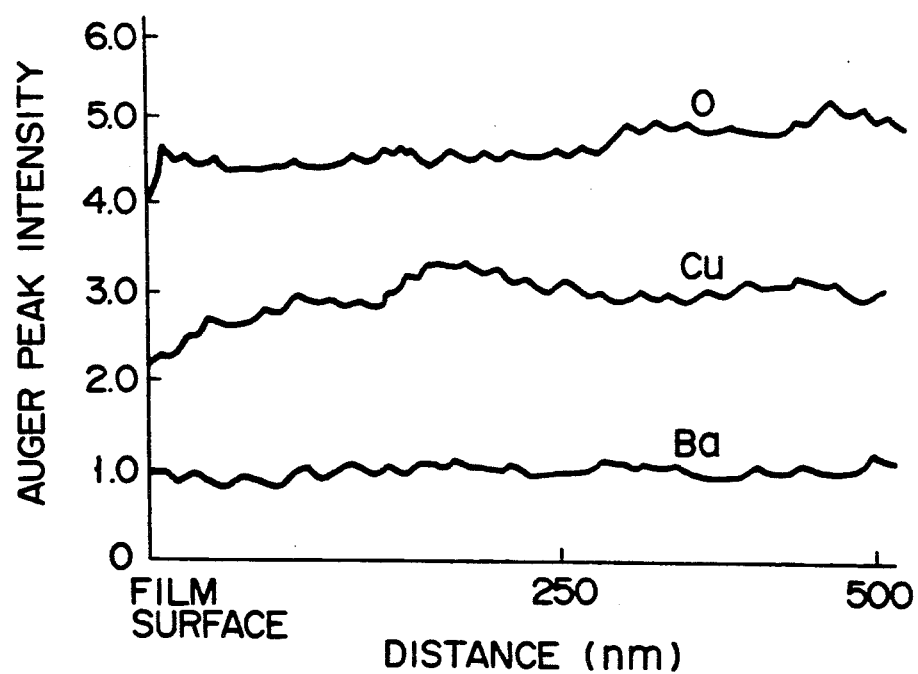
F I G. 7

METHOD FOR MANUFACTURING AN OXIDE SUPERCONDUCTING THIN-FILM

This application is a continuation of application Ser. No. 07/201,857, filed on June 3, 1988, now abandoned.

BACKGROUND OF THE INVENTION

1. Field of the Invention

This invention relates to a method for manufacturing a copper-containing oxide superconducting thin-film on the surface of a substrate, by use of a sputtering method.

2. Description of the Related Art

Nowadays, considerable attention is being paid to an oxide superconductor as a potential high-temperature superconductor This situation has come about as a result of the discovery that a Ba-La-Cu-O type layered perovskite oxide has a high critical temperature Tc. Thereafter, it was shown, in Phys, Rev. Lett. vol. 58. No. 9 pp908 to 910, that an oxygen-deficient perovskite oxide superconductor represented by $YBa_2Cu_3O_{7-\delta}$ has a critical temperature Tc of over 90 K. Since the time of these discoveries, emphasis has been placed on the development of a technique of application of the oxide superconductor. Since, in the field of microelectronics, much consideration has been given to the application of an oxide superconductor to a SQUID (superconducting quantum interference device), HEMT (high electron mobility transistor) interconnection wirings, etc., the thin-film technique is judged to be an essential requisite in the application thereto of the oxide superconductor.

A sputtering operation in an inert gas atmosphere is often performed in the process for forming a thin film of an oxide superconductor. This type of sputtering operation has also been used in the formation of a thin film of $YBa_2Cu_3O_{7-\delta}$, for which reference is invited to Jap. J. Appl. Phys. 26 (1987) L709-710, May 20; H. Adachi et al.

However, when a $YBa_2Cu_3O_{7-\delta}$ thin-film is formed within an inert gas atmosphere, the following problem occurs. That is, if a heat treatment is performed on the thin film in order to obtain a high critical temperature, the critical temperature value varies and is unsatisfactory in some cases. A bulk formed of the oxide superconductor of the afore-mentioned composition will have a relatively stable critical temperature Tc if it is heat treated. A thin film of the same oxide superconductor cannot have a sufficiently stable critical temperature Tc, since it is difficult to heat-treat the thin-film appropriately. As a result, the critical temperature Tc of the thin-film is lower than that of the bulk.

Jap. J. Appln. Phys. 26 (1987) L738 to L740, May 20; M. Kawasaki et al reports a case where, upon the formation of a $YBa_2Cu_3O_{7-\delta}$ thin-film, sputtering is performed within a mixed inert gas/10 to 20% oxygen gas atmosphere, to allow an easy sputtering operation. Using this technique, it is still difficult to obtain a high critical temperature stably.

SUMMARY OF THE INVENTION

It is accordingly an object of the present invention to provide a method for manufacturing an oxygen-deficient perovskite type oxide superconducting thin-film, whereby a high critical temperature Tc can be maintained stably.

A method for the manufacture of an oxide superconducting thin-film according to the present invention comprises the steps of placing a substrate in a mixed gas atmosphere of 0.1 to 5% oxygen gas and an inert gas as a balance, and sputtering a target member containing Ln, M, Cu, and O within this atmosphere to form, on the substrate, an oxygen-deficient perovskite type oxide superconducting thin-film containing Ln, M, Cu, and 0, where Ln represents at least one element selected from the rare earth elements and M represents at least one element selected from the group consisting of Ba, Sr, and Ca.

If, during the manufacture of an oxygen-deficient perovskite type oxide superconducting thin-film, sputtering is performed within a mixed gas atmosphere containing a quantity of oxygen within the aforementioned range, bonding of the oxygen to the superconducting thin-film is promoted, whereby the thin film then contains an appropriate amount of oxygen. Owing to it having an appropriate oxygen content, variation in the composition of the oxide superconducting thin-film is suppressed, making it possible to maintain a high critical temperature Tc stably.

BRIEF DESCRIPTION OF THE DRAWINGS

FIG. 4 is a graph showing a temperature/resistance relation when no oxygen gas is contained within a gas atmosphere upon sputtering;

FIG. 5 is a graph showing a temperature/resistance relation when the percentage of an oxygen gas in a gas atmosphere is 2.5% upon sputtering;

FIG. 6 is a graph showing an element distribution of a thin-film in a thickness direction when no oxygen gas is contained within a gas atmosphere upon sputtering; and FIG. 7 is a graph showing an element distribution of a thin-film in a thickness direction when the percentage of an oxygen gas in a gas atmosphere is 2.5% upon sputtering.

DETAILED DESCRIPTION OF THE PREFERRED EMBOLDENS

Figure 1:
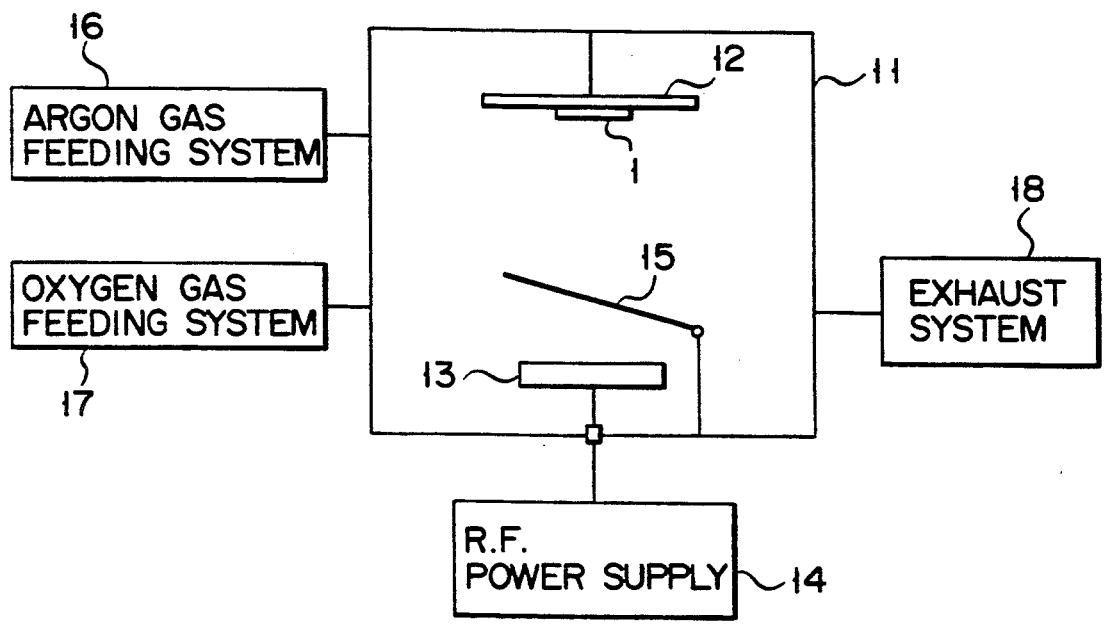
FIG. 1 is a diagrammatic view showing an apparatus for carrying out the method of the present invention.

The present invention will now be explained below in more detail.

The present invention is applied to the manufacture of an oxygen-deficient perovskite type oxide superconducting thin-film. The oxygen-deficient perovskite oxide consists essentially of Ln, M, Cu and 0 where Ln represents at least one kind selected from the rare earth elements and M represents at least one kind selected from the group consisting of Ba, Sr and Ca. This perovskite oxide, for example, is stoichiometrically represented by:

$$Ln:M:Cu:O = 1:2:3:(7-\delta)$$

where $0 < \delta < 1$ ($\delta$: an oxygen deficiency level) The oxygen-deficient perovskite type oxide superconductor of this composition, if properly manufactured, reveals a very high critical temperature Tc of 90 K. In order for such an oxygen-deficient perovskite type oxide to manifest such a high critical temperature Tc, it is not necessarily required to have a stoichiometric composition and, in practice, the percentage of the respective elements may depart about 10% from the stoichometric composition. As the oxygen-deficient perovskite type oxide, $Y_2Ba_4Cu_8O_{20-x}$ may be used in the present invention and, in this case, it is possible to obtain a critical temperature of about 90 K.

The aforementioned Ln may be one or two kinds of the rare earth elements and is preferably Y, Dy, Ho, Er, Yb and Tm.

According to the present invention, such an oxygen-deficient perovskite type oxide superconducting thin-film is formed on a substrate by a sputtering method. This sputtering operation is carried out within a mixed oxygen gas/inert gas atmosphere and the percentage of the oxygen gas in the mixed gas is preferably 0.1 to 5%. Within this range it is possible to obtain a critical temperature of over 77 K and, if Tc=over 77 K, an inexpensive liquid nitrogen can be used as coolant. The oxygen gas percentage within the mixed gas is more preferably 1 to 4%. The inert gas used here belongs to Group-0 elements and is preferably argon. As a substrate used for sputtering, use is made of, for example, a sapphire ($Al_2O_3$), yttria-stabilized zirconia (YSZ), MgO, $SrTiO_3$, $LiTiO_3$ and $LiNbO_3$ substrate or an Si-based substrate having a thin-film formed of these material.

It is necessary that the target or targets as used in the sputtering step contain Ln, M, Cu and 0. For the target, use may be made of a composition which is substantially the same as that of a thin film to be formed. A plurality of targets formed of an Ln oxide, invention.

The oxide superconducting thin-film manufactured according to the present invention has its thickness properly determined according to its object. In order to enable the thin-film to be utilized for electron devices, the thickness of the thin-film is preferably 1000 Å to 10 μm and more preferably 2000 Å to 2 μm.

The gas pressure etc. used during sputtering may be properly determined, taking the various conditions into consideration. According to the present invention, use may be made of various sputtering methods, including a magnetron sputtering for instance.

One example of a sputtering device for carrying out the present invention will now be explained below with reference to FIG. 1.

In FIG. 1, reference numeral 11 shows a sputtering chamber having argon gas feeding system 16, oxygen gas feeding system 17 and exhaust system 18 connected at its side walls. A predetermined amount of argon gas and oxygen gas are introduced from argon gas feeding system 16 and oxygen gas feeding system 17 into sputtering chamber 11. Exhaust system 18 is connected to a vacuum pump, not shown, to allow air in sputtering chamber 11 to be exhausted and hence to maintain the interior of sputtering chamber 11 at a predetermined vacuum level. Substrate holder 12 is arranged at the upper portion of sputtering chamber 11 with its upper surface held in a horizontal direction. Substrate 1 is supported on the lower surface of substrate holder 12. Within sputtering chamber 11 target 13 whose composition is controlled to a desired value is located beneath substrate holder 12. Shutter 15 is located relative to target 13 and between target 13 to radio frequency (R.F.), power supply 14 and holder 12 and can be opened and closed.

Figure 2:
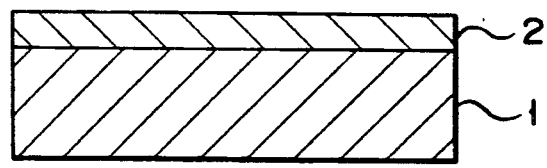
FIG. 2 is a cross-sectional view showing an oxide superconducting thin-film formed on a substrate.

With such device, the interior of sputtering chamber 11 is reduced down to a predetermined vacuum level within sputtering chamber 1 with substrate 1 set on holder 12 within sputtering chamber 11. Then a predetermined flow amount of argon gas and oxygen gas are introduced from argon gas feeding system 16 and oxygen gas feeding L system 17 into sputtering chamber 1 to provide a mixed gas atmosphere of the aforementioned composition within sputtering chamber 11. Then with shutter 15 closed, RF L power is supplied from power supply 14 to target 13 to carry out sputtering operation. By so doing, oxygen-deficient perovskite type oxide superconducting thin-film 2 is formed on substrate 1 as shown in FIG. 2.

EXAMPLE

We will now explain the present invention in accordance with Examples as set out below.

EXAMPLE 1

Six kinds of substrates were prepared, three of which were 0.3 mm×10 mm×10 mm $Al_2O_3$, $LiTaO_3$ and $LiNbO_3$ substrates and three of which were 1 mm×10 mm×10 mm YSZ, MgO and $SrTiO_3$. The substrate was set on the device shown in FIG. 1 and mixed gas of an argon gas and oxygen gas, each of 99.999% purity, were fed into the sputtering chamber, while varying the content of the oxygen gas within a range of 0 to 10%, to obtain a pressure of $5 \times 10^{-3}$ Torr within the sputtering chamber. Then an RF power of 300 W was supplied to $Y_1Ba_2Cu_3O_{7-\delta}$ target to sputter. By so doing, a thin-film was deposited on the respective substrate to obtain a sample. The thin-film formed on the respective substrate was made 500 nm in thickness. In this connection it is to be noted that the face of the thin-film deposed on the substrate was an R-face for the $Al_2O_3$ substrate and (100) face for the other substrates.

Upon the chemical analysis of the thin-films so prepared, it has been found that, in any of samples obtained, the molar ratio of the respective elements was substantially Y:Ba:Cu=1:2:3 irrespective of the oxygen percentage.

Figure 3:
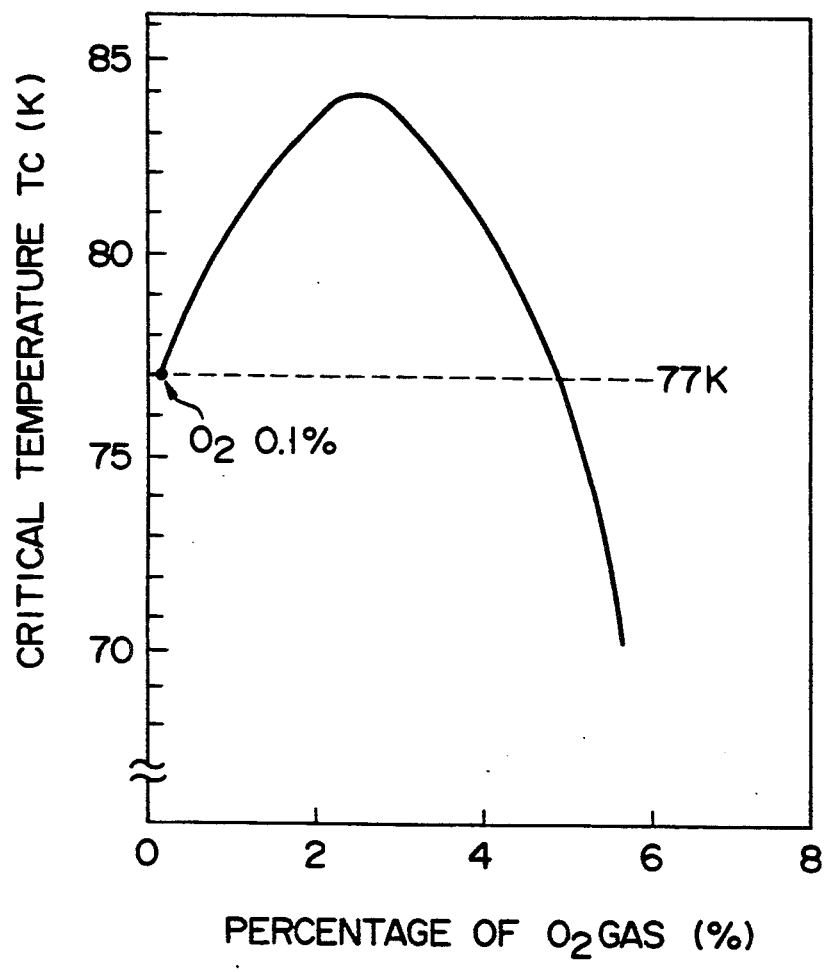
FIG. 3 shows a graph showing a relation of the percentage of an oxygen gas in a gas atmosphere upon sputtering to a critical temperature Tc.

The sample was heat-treated for 2 hours at 900° C. and then the critical temperature Tc of the respective sample was measured in terms of its superconduction. In this case, a critical temperature Tc use was sought at which the electrical resistivity as measured by a 4-terminal method was made zero. FIG. 3 shows a relation of the percentage of the oxygen gas to the Tc. As evident from FIG. 3, the percentage of the oxygen gas increases up to 2.5% and it decreases beyond that percentage. When the percentage of the oxygen gas was 6%, the critical temperature Tc was similar to the case where sputtering operation was performed within a pure argon gas atmosphere free from any oxygen gas. For the oxygen gas percentage of 2.5%, the critical temperature Tc was 84 K at max. and for the oxygen gas ratio of 0.1 to 5% the critical temperature Tc was over 77 K, an upper limit temperature of a liquid nitrogen. The same result was obtained for any of the respective substrates.

FIGS. 4 and 5 each show a relation of a temperature for an oxygen percentage of 0% and 2.5% to a resistivity measured by the 4-terminal method, in which case an $SrTiO_3$ substrate was used. From FIGS. 4 and 5 it has been confirmed that the critical temperature Tc is 84° C. for the oxygen gas percentage of 2.5% and about 70° C. for the oxygen gas percentage of 0%. The composition of the thin-film obtained was Y:Ba:Cu=1:2.03:2.97      (FIG. 4)

$Y\ Ba\ Cu = 1:2.09:3.03$ (FIG. 5)

substantially in agreement with 1:2:3.

The effect confirmed upon the application of an oxygen gas (sputtering gas) will now be explained below. The distribution of the composition in the direction of the film thickness was measured by an Auger electron spectroscopy while etching the thin-film by argon ions in a direction from the film surface side toward the substrate surface side. As will be seen from FIG. 6, for a sample obtained by performing sputtering operation by a pure argon entirely free from any oxygen gas, more Cu component is present near the film surface, but low in the interior of the film. This shows that more Cu component is mobilized near the film surface by a heat treatment. For a sample obtained by performing sputtering operation within the mixed gas atmosphere containing 2.5% of oxygen, on the other hand, the respective elements of the thin-film is uniformly distributed, as shown in FIG. 7, after the heat-treatment is performed. From this it has been confirmed that the segregation of the Cu component in the thin-film is prevented by performing sputtering operation within the mixed gas atmosphere containing oxygen.

EXAMPLE 2

Using $Dy_1Ba_2Cu_3O_{7-\delta}$, $Ho_1Ba_2Cu_3O_{7-\delta}$, $Er_1Ba_2Cu_3O_{7-\delta}$, $Yb_1Ba_2Cu_3O_{7-\delta}$ and $Tm_1Ba_2Cu_3O_{7-\delta}$ targets, sputtering operation was performed under the same conditions as in Example 1 and then a heat treatment was carried out to obtain thin-film samples. The critical temperatures Tc of these samples were measured, revealing that they were 80 to 83 K when the oxygen gas percentage in the mixed gas atmosphere was about 2.5% upon sputtering and over 77 K when the oxygen gas percentage in the mixed gas atmosphere was 0.1 to 0.5%.

Control

Tests were performed under the same conditions as in Example 1 except that a nitrogen gas having 0.1 to 5.0% in the mixed gas atmosphere was used as the sputtering gas in place of the oxygen gas to obtain samples. For any examples, the critical temperatures Tc were under 77 K.

What is claimed is:

1. A method for manufacturing an oxide superconducting thin-film on a substrate, comprising the steps of:
   setting a substrate within a mixed gas atmosphere containing 0.1 to 5% of an oxygen gas and a balance of an inert gas;
   sputtering a target member containing Ln, M, Cu, and O within said mixed gas atmosphere to form an oxygen-deficient perovskite type oxide superconducting thin-film on said substrate, said thin-film containing Ln, M, Cu, and O, where Ln represents at least one element selected from the rare earth elements and M represents at least one element selected from the group consisting of Ba, Sr and Cu.

2. The method according to claim 1, wherein said mixed gas atmosphere contains 1 to 4% of said oxygen gas.

3. The method according to claim 1, wherein said substrate is made of one material selected from the group consisting of $Al_2O_3$, YSZ, MgO, $SrTiO_3$, $LiTaO_3$, and $LiNbO_3$.

4. The method according to claim 1, wherein said oxide superconducting thin-film has a thickness of 1000 Å to 10 μm.

5. The method according to claim 4, wherein said oxide superconducting thin-film has a thickness of 2000 Å to 2 μm.

6. The method according to claim 1, wherein said oxygen-deficient perovskite type superconducting thin-film contains Ln, M, Cu, and O at an atomic ratio of substantially $1:2:3:(7-\delta)$ wherein $0 < \delta < 1$ ($\delta$: An oxygen deficiency level).

7. The method according to claim 6, wherein Ln is at least one element selected from the group consisting of Y, Dy, Ho, Er, Yb, and Tm.

8. The method according to claim 1, wherein said inert gas contains argon.

9. The method according to claim 1, wherein said target member comprises a target having a composition substantially the same as that of a thin film which is formed on said substrate.

10. The method according to claim 1, wherein said target member comprises a plurality of targets containing an Ln oxide, M oxide, and Cu oxide, respectively.

* * * * *